United States Patent [19]

Kim

[11] Patent Number: 5,595,931
[45] Date of Patent: Jan. 21, 1997

[54] METHOD FOR FABRICATING CAPACITOR OF A SEMICONDUCTOR DEVICE

[75] Inventor: Suk S. Kim, Kyoungki-do, Rep. of Korea

[73] Assignee: Hyundai Electronics Industries Co., Ltd., Kyoungki-do, Rep. of Korea

[21] Appl. No.: 491,702

[22] Filed: Jun. 19, 1995

[30]  Foreign Application Priority Data

Jun. 30, 1994 [KR] Rep. of Korea ............... 94-15429

[51] Int. Cl.$^6$ ................................................. H01L 21/70
[52] U.S. Cl. ...................... 437/60; 437/47; 437/919; 148/DIG. 14
[58] Field of Search ...................... 437/60, 47, 52, 437/919; 148/DIG. 14

[56] References Cited

U.S. PATENT DOCUMENTS

| | | | |
|---|---|---|---|
| 5,053,351 | 10/1991 | Fazan et al. | 437/52 |
| 5,071,781 | 12/1991 | Seo et al. | 437/47 |
| 5,135,883 | 8/1992 | Bae et al. | 437/60 |
| 5,137,842 | 8/1992 | Chan et al. | 437/60 |
| 5,164,337 | 11/1992 | Ogawa et al. | 437/47 |
| 5,432,116 | 7/1995 | Keum et al. | 437/60 |
| 5,436,186 | 7/1995 | Hsue et al. | 437/919 |
| 5,449,635 | 9/1995 | Jun | 437/60 |

FOREIGN PATENT DOCUMENTS 4229363  3/1993  Germany .

*Primary Examiner*—Tuan H. Nguyen
*Attorney, Agent, or Firm*—Nath & Associates; Gary M. Nath

[57] ABSTRACT

A method for fabricating a capacitor useful for ultra large scale integration semiconductor devices of 64M DRAM or larger, comprising the steps of: laminating a plurality of insulating layers which are different in etch selection ratio from one another; selectively etching the insulating layers to make a cavity between the insulating layers; depositing a polysilicon layer for a storage electrode over the resulting structure, to fill the cavity; and subjecting the polysilicon layer to etch back to form a spacer.

2 Claims, 3 Drawing Sheets

METHOD FOR FABRICATING CAPACITOR OF A SEMICONDUCTOR DEVICE

BACKGROUND OF THE INVENTION

1. Field of the Invention

The present invention relates, in general, to a method for the fabrication of a DRAM cell and, more particularly, to a capacitor useful for ultra large scale integration devices of 64M DRAM or larger.

2. Description of the Prior Art

The high integration of memory devices is accompanied by a great decrease in the area occupied by unit cells, making it difficult to secure the capacitance necessary to operate the memory devices. In addition, the higher the integration is, the larger the capacitance must be. Many attempts have been made to augment the capacitance in response to the securing of sufficient capacitance in such reduced area. For example, various three dimensional structures of a capacitor, such as stack, cylinder, fin and so on, have been adopted.

A significant disadvantage of the conventional techniques is that too many process steps must be undertaken to increase the capacitance, along with poor topology of the resulting capacitor.

SUMMARY OF THE INVENTION

Accordingly, it is a principal object of the present invention to provide a method for fabricating a capacitor having a large capacitance by use of insulating layers different in etch selection ratio and which avoids the aforementioned problems associated with the prior art.

In accordance with the present invention, there is provided a method for fabricating a capacitor of a semiconductor device, comprising the steps of: forming a contact hole in a stack structure consisting of a first insulating layer and a second insulating layer, which are sequentially formed on a substrate; depositing a first polysilicon layer to fill the contact hole and forming a first photosensitive film pattern for a storage electrode mask on the first polysilicon layer; etching the material from the first polysilicon layer away to an appropriate depth, to form a protrusion, with the first photosensitive film serving as a mask; removing the first photosensitive film pattern and depositing a third insulating film, a fourth insulating film and a fifth insulating film, in sequence; forming a second photosensitive film pattern for a storage electrode mask, wider than the first photosensitive film pattern, on the fifth insulating layer; sequentially subjecting the fifth, the fourth and the third insulating films and the first polysilicon layer to dry etch to form a third insulating layer pattern, a fourth insulating layer pattern, a fifth insulating layer pattern, and a first polysilicon layer pattern, respectively, with said second photosensitive film pattern serving as a mask; removing the second photosensitive film pattern and excavating the fourth insulating layer pattern to some extent to form a cavity between the third and the fifth insulating layer patterns; depositing a second polysilicon layer over the resulting structure to fill the cavity and subjecting the second polysilicon layer to etch back to form a spacer at the side wall of the third and the fifth insulating layer patterns, said spacer being in electrical connection with the first polysilicon layer pattern and the second polysilicon layer remaining in the cavity; removing the materials from the fifth, the fourth and the third insulating film patterns and the second insulating layer by wet etch, to expose a storage electrode consisting of the first polysilicon layer pattern and the second polysilicon spacer, a part of which extends over the first polysilicon layer pattern; and coating a dielectric film on the surfaces of the storage electrode and forming a plate electrode along the surfaces.

BRIEF DESCRIPTION OF THE DRAWINGS

The above object and other advantages of the present invention will become more apparent by describing in detail the preferred embodiments of the present invention with reference to the attached drawings in which.

DETAILED DESCRIPTION OF THE PREFERRED EMBODIMENTS

Figure 1:
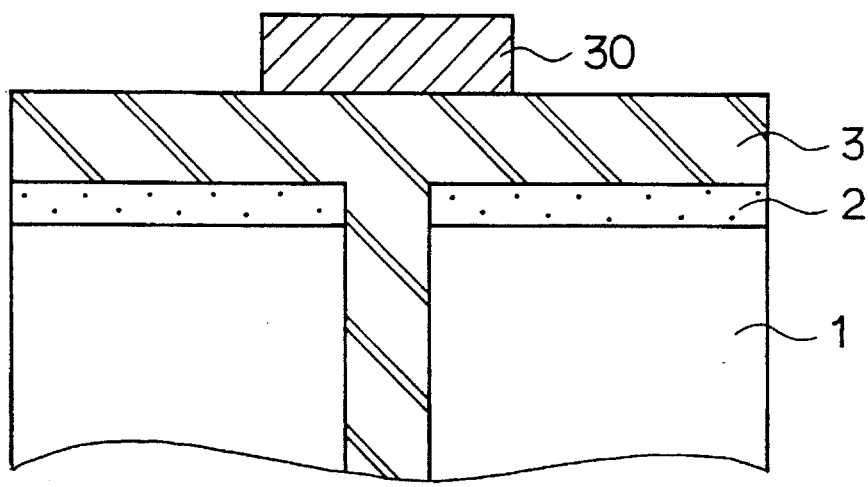
FIGS. 1 through 6 are schematic cross sectional views illustrating the fabrication process steps of a capacitor of a semiconductor device.

The application of the preferred embodiments of the present invention is best understood with reference to the accompanying drawings, wherein like reference numerals are used for like and corresponding parts, respectively.

FIGS. 1 to 6 illustrate the process steps of fabricating a capacitor applicable to a DRAM cell, according to the present invention, in which the MOSFET on a semiconductor substrate is omitted for convenience. B To begin with, a capacitor contact hole is formed in an insulating stack of a first insulating layer 1 for planarization and a second insulating layer 2, as shown in FIG. 1. Thereafter, a first polysilicon layer 3 is deposited on the resulting structure to fill the contact hole, followed by the formation of a first photosensitive film pattern 30 for a storage electrode mask on a predetermined area of the first polysilicon layer 3.

Figure 2:
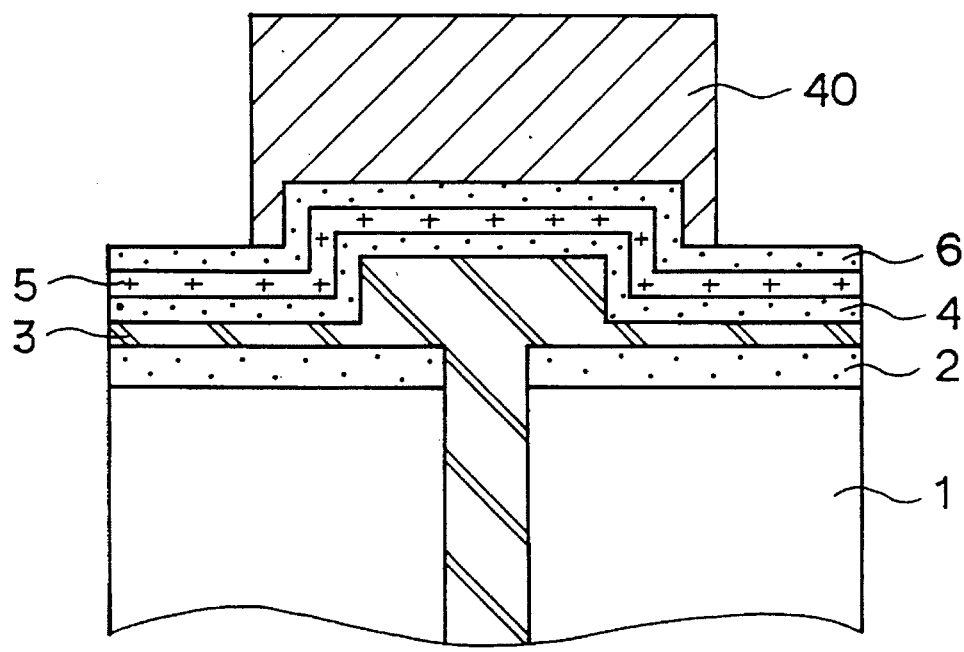

With reference to FIG. 2, the material from the first polysilicon layer 3 is etched away to an appropriate depth by use of the first photosensitive film pattern 30 as a mask so as to form a protrusion and then the first photosensitive film pattern 30 is removed. Thereafter, a third, a fourth and a fifth insulating layers 4, 5 and 6, which differ in wet etch selection ratio from one another, are sequentially formed on the etched first polysilicon layer 3 by controlling source gases in the same chamber, followed by the formation of a second photosensitive film pattern 40, wider than the first photosensitive film pattern 30, on the fifth insulating film 6. The third, the fourth and the fifth insulating layers 4,5 and 6 may be made of oxides, the third being superior to the others in wet etch selection ratio.

Figure 3:
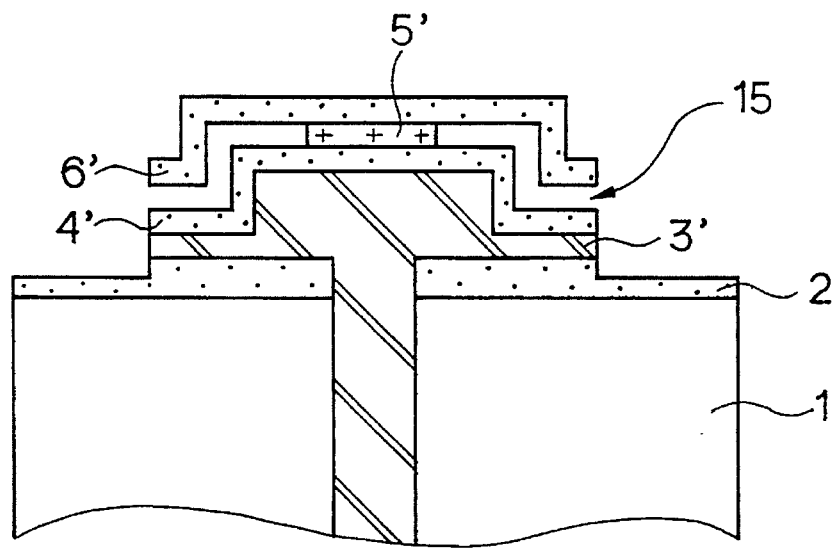

FIG. 3 is a cross section after a dry etch process is undertaken, and followed by a wet etch process. Using the second photosensitive film pattern 40 as a mask, the fifth, the fourth and the third insulating layers 6, 5 and 4 and the first polysilicon layer 3 are subjected to dry etch, to form a fifth, a fourth and a third insulating layer patterns 6', 5' and 4' and a first polysilicon layer pattern 3', respectively. This dry etch is further carried out to etch the material from the second insulating layer 2 away to an appropriate depth. Thereafter, wet etch excavates the fourth insulating film pattern 5' to some extent, to form a cavity between the third insulating layer pattern 4' and the fifth insulating layer pattern 6'.

Figure 4:
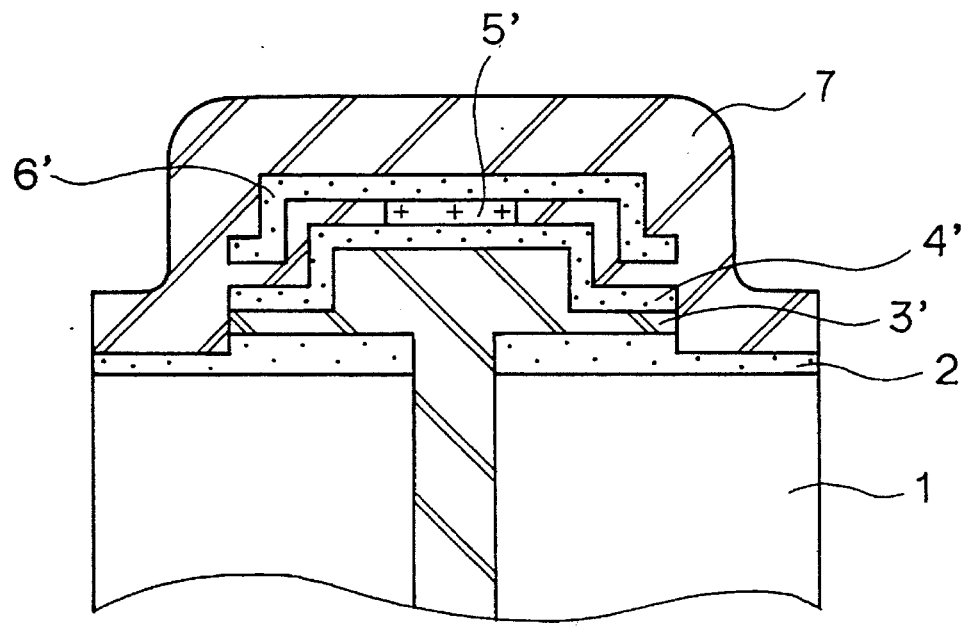

FIG. 4 is a cross section after a second polysilicon layer 7 is deposited over the resulting structure, to fill the cavity between the third insulating layer pattern 4' and the fourth insulating layer pattern 6'.

Figure 5:
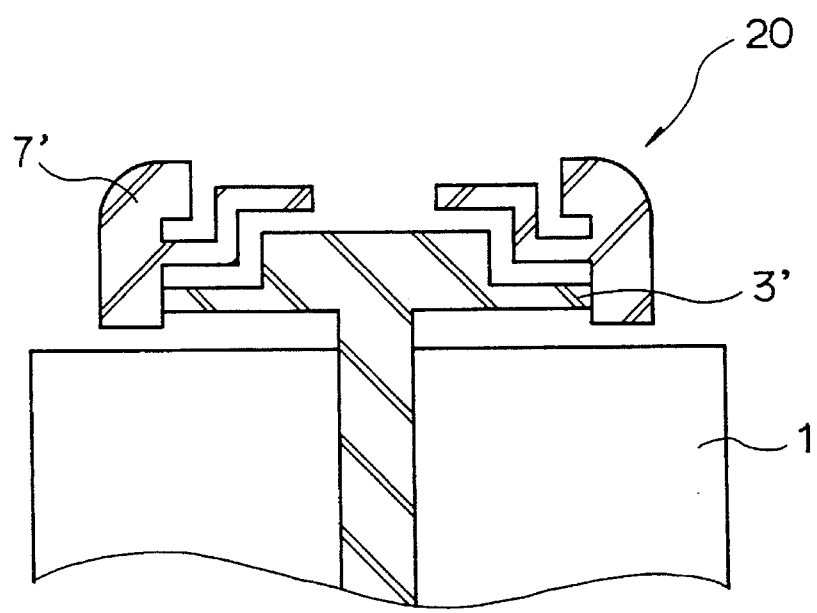

With reference to FIG. 5, the second polysilicon layer 7 is subjected to etch back to form a second polysilicon layer spacer 7' at the side wall of the third and fifth insulating layer patterns 4' and 6', which is electrically connected with the second polysilicon film 7 remaining in the cavity and the first polysilicon film pattern 3'. The materials from the third, fourth and fifth insulating layer patterns 4', 5' and 6' and the second insulating film 2 are wet etched away, to expose the surfaces of a storage electrode 20 consisting of the polysilicon layer pattern 3' and the second polysilicon layer spacer 7', a part of which extends over the first polysilicon layer pattern 3'.

Figure 6:
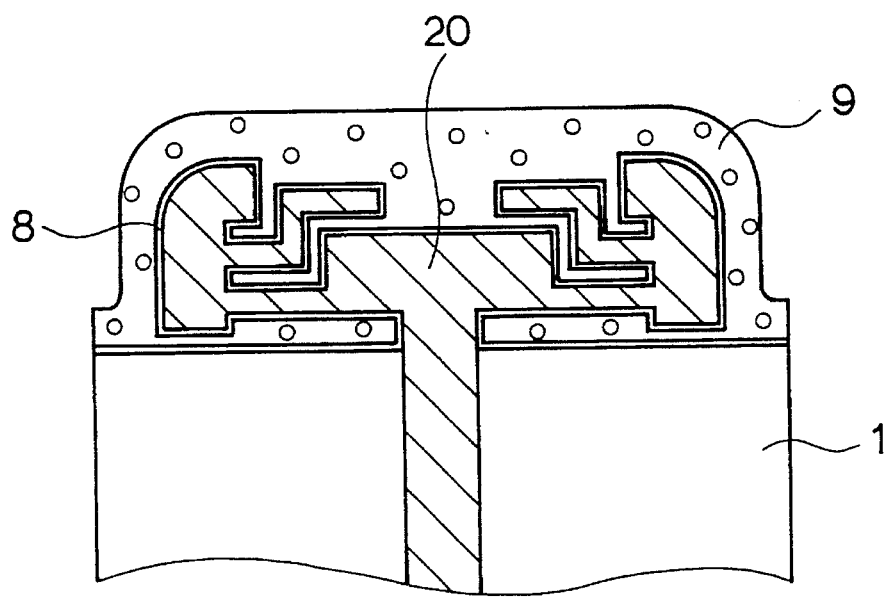

FIG. 6 is a cross section after a dielectric film is coated on the surfaces of the storage electrode 20, followed by the deposition of a third polysilicon layer 9 for plate electrode over the storage electrode 20.

As described hereinbefore, a capacitor suitable for the next generation semiconductor devices can be obtained by forming a polysilicon layer in a cavity which is between a plurality of oxide layers, and which differ in etch selection ratio from one another.

Other features, advantages and embodiments of the invention disclosed herein will be readily-apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for fabricating a capacitor of a semiconductor device, comprising the steps of:

forming a contact hole in a stack structure consisting of a first insulating layer and a second insulating layer, which are sequentially formed on a substrate;

depositing a first polysilicon layer to fill the contact hole and forming a first photosensitive film pattern for a storage electrode mask on the first polysilicon layer;

etching the material from the first polysilicon layer away to an appropriate depth, to form a protrusion, with the first photosensitive film serving as a mask;

removing the first photosensitive film pattern and sequentially depositing a third insulating film on the entire structure of said first polysilicon layer formed after said removing process, depositing a fourth insulating film on said third insulating film, and depositing a fifth insulating film on said fourth insulating film;

forming a second photosensitive film pattern for a storage electrode mask, wider than the first photosensitive film pattern, on the fifth insulating layer;

sequentially subjecting the fifth, the fourth and the third insulating films and the first polysilicon layer to dry etch to form a third insulating layer pattern, a fourth insulating layer pattern, a fifth insulating layer pattern, and a first polysilicon layer pattern, respectively, with said second photosensitive film pattern serving as a mask;

removing the second photosensitive film pattern and excavating the fourth insulating layer pattern to some extent to form a cavity between the third and the fifth insulating layer patterns;

depositing a second polysilicon layer over the resulting structure to fill the cavity and subjecting the second polysilicon layer to etch back to form a spacer at the side wall of the third and the fifth insulating layer patterns, said spacer being in electrical connection with the first polysilicon layer pattern and the second polysilicon layer remaining in the cavity;

removing the materials form the fifth, the fourth and the third insulating film patterns and the second insulating layer by wet etch, to expose a storage electrode consisting of the first polysilicon layer pattern and the second polysilicon spacer, a part of which extends over the first polysilicon layer pattern; and coating a dielectric film on the surfaces of the storage electrode and forming a plate electrode along the surfaces.

2. A method in accordance with claim 1, wherein said fourth insulating layer is made of a material which differs in wet etch selection ratio from those of the third insulating layer and the fifth insulating layer.

\* \* \* \* \*